United States Patent [19]

Byram

[11] Patent Number: 5,030,913
[45] Date of Patent: Jul. 9, 1991

[54] MULTIPLE SENSOR MAGNETOMETER WITH TEMPORAL NOISE REJECTION AND CONTROLLABLE SPATIAL RESPONSE ON A MOVING PLATFORM

[75] Inventor: George W. Byram, San Diego, Calif.

[73] Assignee: The United States of America as represented by the Secretary of the Navy, Washington, D.C.

[21] Appl. No.: 390,421

[22] Filed: Jun. 21, 1982

[51] Int. Cl.$^5$ .......................... G01R 33/02; G01V 3/15
[52] U.S. Cl. .................................... 324/244; 324/345; 367/16; 364/421
[58] Field of Search ............... 324/244, 245, 331, 345, 324/346; 364/421, 724; 367/16, 19, 22

[56] References Cited

U.S. PATENT DOCUMENTS

| | | | |
|---|---|---|---|
| 2,635,134 | 4/1953 | Jenny | 324/331 |
| 3,023,359 | 2/1962 | Jenny et al. | 324/331 |
| 3,490,032 | 1/1970 | Zurflueh | 324/331 X |
| 3,536,992 | 10/1970 | Jensen et al. | 324/331 |
| 3,675,052 | 7/1972 | Lindsey et al. | 333/142 X |
| 3,887,897 | 6/1975 | Neitzel et al. | 367/22 X |
| 3,924,176 | 12/1975 | Fletcher et al. | 324/248 |
| 3,943,436 | 3/1976 | Pirson et al. | 324/345 |
| 3,976,937 | 8/1976 | Hearn | 324/331 |
| 4,208,732 | 6/1980 | Ruehle | 364/421 X |
| 4,305,034 | 12/1981 | Long et al. | 324/253 |
| 4,386,318 | 5/1983 | Burbank | 324/244 |
| 4,388,693 | 6/1983 | Nakayama | 364/724 |

Primary Examiner—Gerard R. Strecker
Assistant Examiner—Warren S. Edmonds
Attorney, Agent, or Firm—Harvey Fendelman; Thomas Glenn Keough; John Stan

[57] ABSTRACT

A mobile magnetometry processing system which scans an area in order to measure the magnetic field strength over the area, comprising:

a plurality of N sensors for sensing the magnetic field of the area being scanned, each sensor generating an output signal, for example, a voltage, which is a function of the magnetic field it scans, the sensor being aligned in the general direction of the motion of the system;

a plurality of N sets of means for weighting, for receiving and weighting the N signals from the means for sensing, each of the N sets comprising M weighting means;

a plurality of M summers, each have N inputs, one from each of the N sets of means for weighting, for summing its N input weighted signals;

a plurality of M filters each having an input which is connected to the output of a summer, for delaying the exit of an input signal by an amount of time equal to the time required for a sensor to advance the distance to the nearest adjacent sensor, the filtering process comprising a convolution;

means, associated with the M filters, for measuring the velocity of the magnetometry processing system and thereby determining the delay of the M filters; and an output summer, whose M inputs are connected to the outputs of the M filters, the output signal being a measure of the strength of the magnetic field of the area being traversed by the sensors.

10 Claims, 5 Drawing Sheets

STRUCTURE OF THE CLASS OF PROCESSORS

FIG. I. MOBILE MAGNETOMETRY SYSTEM IN ITS SIMPLEST FORM (SINGLE-CHANNEL CASE).

FIG. 2. STRUCTURE OF THE CLASS OF PROCESSORS

FIG. 3. ALTERNATIVE IMPLEMENTATION OF PROCESSORS.

NOTE:
ALL RESPONSES SHOWN HAVE ZERO NET AREA.

FIG. 4. TYPICAL SPATIAL RESPONSE FUNCTIONS DESIRABLE FOR A MAGNETOMETER.

FIG.5. RESPONSE OF 35-POINT FILTER

FIG.6. IMPULSE RESPONSE OF TRUNCATED INVERSE FILTER.

FIG.7. SPATIAL RESPONSE WITH TRUNCATED FILTER.

FIG. 8. ADDITION OF A/D CONVERTER

MULTIPLE SENSOR MAGNETOMETER WITH TEMPORAL NOISE REJECTION AND CONTROLLABLE SPATIAL RESPONSE ON A MOVING PLATFORM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

The invention relates to a mobile magnetometry processing system which improves the performance of mobile magnetometers through improved signal processing techniques which provide better separation of the spatial and temporal portions of ambient fields. A high degree of control over the spatial response function is provided. Responses corresponding to an aperture greater than that implied by the length of the sensor's string can be obtained. The magnetic field in the vicinity of the surface of the Earth is divided into two major components. These are:

(1) A time-varying component due to magnetic storms, lightning, circulating currents in the ionosphere, etc. This component will be referred to herein as the temporal component.

(2) A relatively steady component whose value depends on the location at which it is measured. This component is due to mineral deposits, large magnetic objects, etc. This component will be referred to herein as the spatial component.

2. Description of the Prior Art

Measurements of the spatial component of the magnetic field are of interest for applications including mineral prospecting and locating ferrous objects. Such measurements are made from a mobile platform such as an aircraft to permit the magnetic sensor to scan a significant geographic region. Since the output of a sensor moving through a spatially patterned field will be a time-varying signal, it is difficult to separate these spatially related components from the temporally induced components which would cause a time-varying signal even if the sensor were stationary. Separating these components is a major problem in mobile magnetometry. In addition, it is generally desired to examine the detailed local structures of the spatial component with minimal interference from its gross variation over large distances.

Prior art attempts to solve these problems have generally involved differencing the outputs of a pair of magnetometers to measure the gradient of the field. This provides good rejection of temporal components but greatly constrains the spatial response function of the instrument. It is also possible to compare the outputs of fixed and moving magnetometers. This, however, restricts the search area to the vicinity of the fixed magnetometer. A slow search with a single magnetometer will provide time averaging over the temporal component. It is also possible to average over successive passes, or scans, through the same search area. Both of these approaches result in greatly increased search time.

SUMMARY OF THE INVENTION

A number N of total field magnetometers are towed in a line, the outputs being combined into M weighted sums for processing by M convolutional filters, to form the entries of a final sum, which is the system output. The time scales of the convolutional filters are continually adjusted to match their intersample delay to the time required for a sensor to advance the intersensor distance.

Constraints on the M sequences of N weights and on the filter response functions are specified to permit either:

(1) Rejection of magnetic field components sensed simultaneously at all sensors while approximately a specified spatial response function for components encountered sequentially by the moving sensors; or (2) Rejection of magnetic field components encountered sequentially by the moving sensors while approximately a specified temporal response function for components sensed simultaneously at all sensors. The length of the spatial response functions achieved can exceed the length of the line of sensors due to the memory inherent in the convolutional filters. Similarly the duration of the temporal response functions achieved can exceed the time required to advance the length of the line of sensors.

Implementation can be either analog or digital or a hybrid of both. Charge transfer devices are particularly convenient for implementation of the filters since their clock rate can be varied to adjust the time scale.

OBJECTS OF THE INVENTION

An object of the invention is to provide a mobile magnetometry processing system which rejects temporally fluctuating components of the Earth's field and controls the contribution of the spatial portion of the Earth's field.

Another object of the invention is to provide such a magnetometry processing system which enhances sensitivity to localized magnetic anomalies.

Yet another object of the invention is to provide such a system which has low response to gross slow spatial fluctuations and a high response to spatially localized anomalies.

A further object of the invention is to provide such a system wherein the spatial extent of the response function is not limited by the length of the string of sensors.

DESCRIPTION OF THE PREFERRED EMBODIMENT

Figure 1:
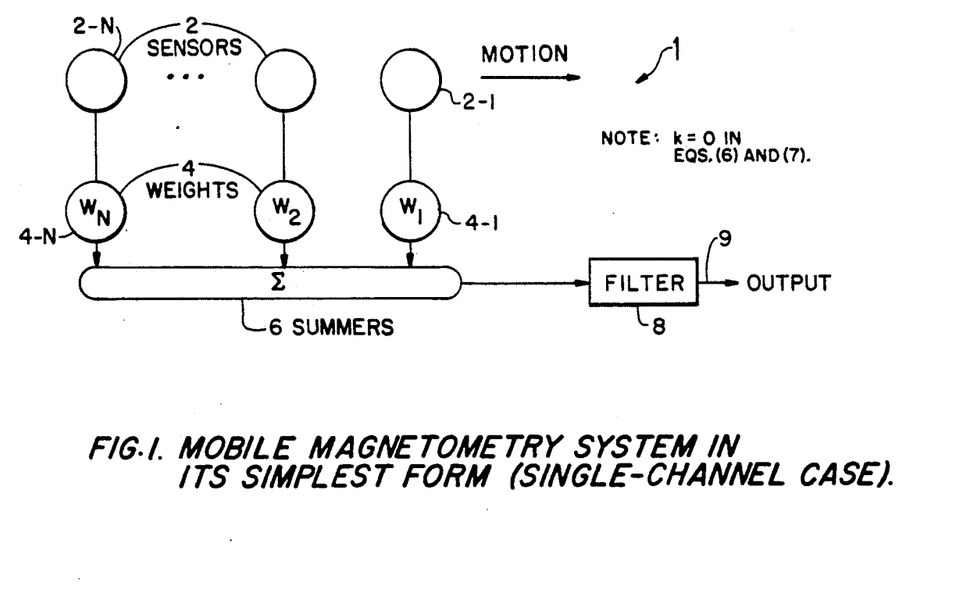
FIG. 1 is a block diagram showing the structure of this invention in its simplest form (single-channel case).

Reference is now directed to FIG. 1, wherein is shown a simple implementation of the invention.

To better understand the operation, the signal will be followed through one sum, through summer 6, and its corresponding filter 8 to the output 9. Let the sensor 2 outputs be $P_i$, i=1 to N, where i=1 corresponds to the lead sensor 2-1 and i=N corresponds to the last sensor 2-N. If the Kth sum be considered, then these get weighted, in weighting means 4, by the sequence of weights $W_{ik}$. The sum $C_k$ at the output of summer 6 is then $$C_5 = \Sigma P_i W_{ik} \tag{1}$$

The magnetic field over which the N sensors 2 are towed may be represented as $$T(t) + S(s) \tag{2}$$

where T is the temporal component, which is a function only of time within local regions of a mile or so extent, and S is the spatial component, which is a function only of a distance variable over relatively long time intervals.

The sum $C_k$ can then be represented as $$C_k = T(t)\Sigma W_i + S(s) * W_{ik}, \tag{3}$$

where the * denotes convolution. This relation is the basis for the processing technique described herein. The temporal component appears weighted by the sum of the weights while the spatial component along the direction of travel of the sensors 2 appears convolved with the sequence of weights 4.

If a convolutional filtering operation, in filter 8, be now performed with a sequence $F_{jk}$, the output will be $$\left( T(t) \sum_{i=0}^{N-1} W_{ik} \right) F_{jk} + S(s) * W_{ik} * F_{jk} \tag{4}$$

A different index, j, has been used for the filter sequence to emphasize the fact that it need not be the same length as the weight sequence. Both i and j correspond to the spatial variable s.

Figure 2:
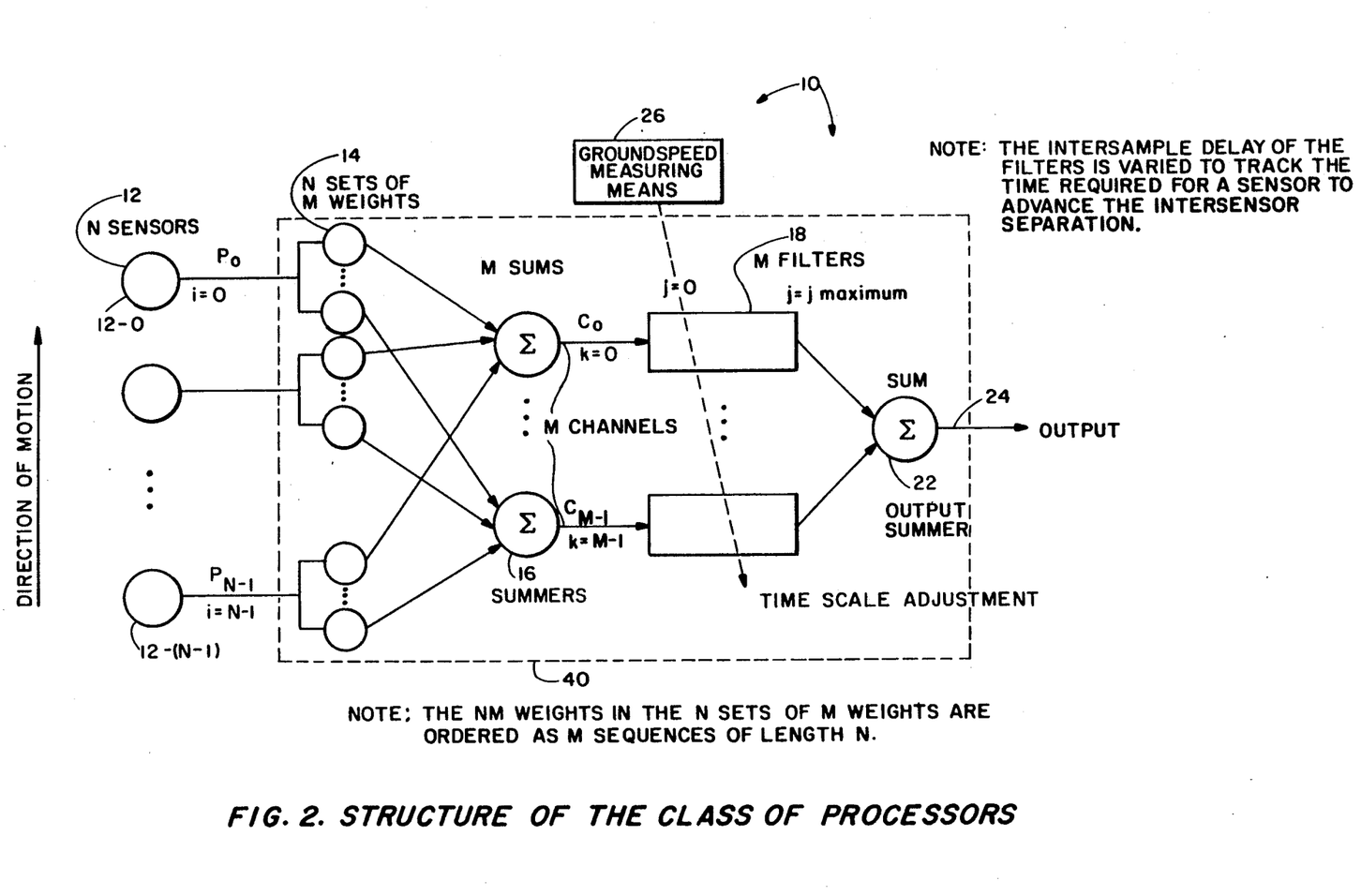
FIG. 2 is a block diagram showing a generalized implementation based on the use of multiple sequences of weights (multiple-channel case).

Reference is now directed to FIG. 2, wherein is shown a generalized implementation 10 based on the use of multiple sequences of weights.

In general, the outputs of N sensors 12 are weighted by M sequences of N weights 14 to form M sums, in summers 16, of weighted sensor outputs. These M sums are then convolutionally filtered by M filters 18, whose outputs are summed in summer to form the final output 24. A means 26 for measuring the ground speed is required in order that the time scale of the filters 18 be continually adjusted to match the speed of motion of the sensors 12.

The total output of the processor 10 is then the sum of the outputs of the N individual channels 17;

$$\sum_{k=0}^{M-1} \left( \left( T(t) \sum_{i=0}^{N-1} W_{ik} \right) F_{jk} + S(s) * W_{ik} * F_{jk} \right) \tag{5}$$

The following two conditions may be imposed to guide the selection of the sequences $W_{ik}$ and $F_{jk}$.

$$\text{(a)} \sum_{k=0}^{M-1} \left( \sum_{i=0}^{N-1} W_{ik} \right) F_{jk} = 0 \tag{6}$$

$$\text{(b)} \sum_{k=0}^{N-1} W_{ik} * F_{jk} \tag{7}$$

approximates the desired spatial response function.

Condition (a) is necessary to prevent feedthrough of the temporal portion of the signal. In the single channel case, k=0, it is equivalent to a requirement that the weight sequence be unbiased. More flexibility is available in the multichannel case since it is possible to take advantage of channel-to-channel cancellations in some cases. The extent to which condition (b) can be satisfied depends in part on the form of the desired spatial response function.

Figure 4A:
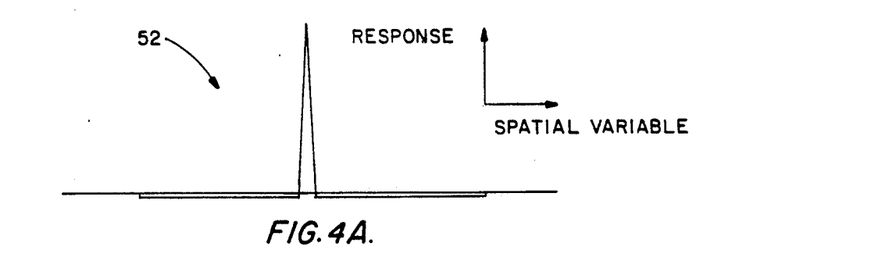
FIG. 4A–C shows a set of three graphs showing typical spatial response functions desirable for a magnetometer used to examine local fine spatial detail in the presence of a slowly changing spatial background and temporally fluctuating interference.
Figure 4B:
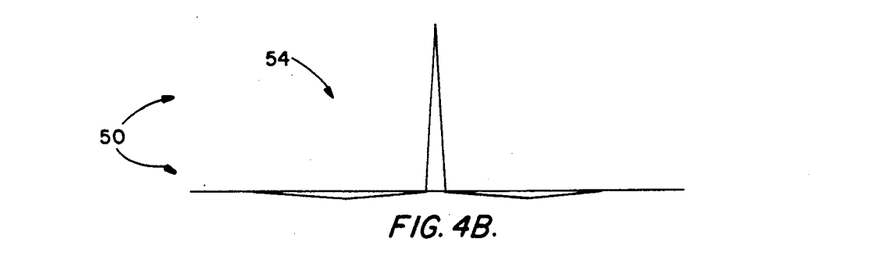
Figure 4C:
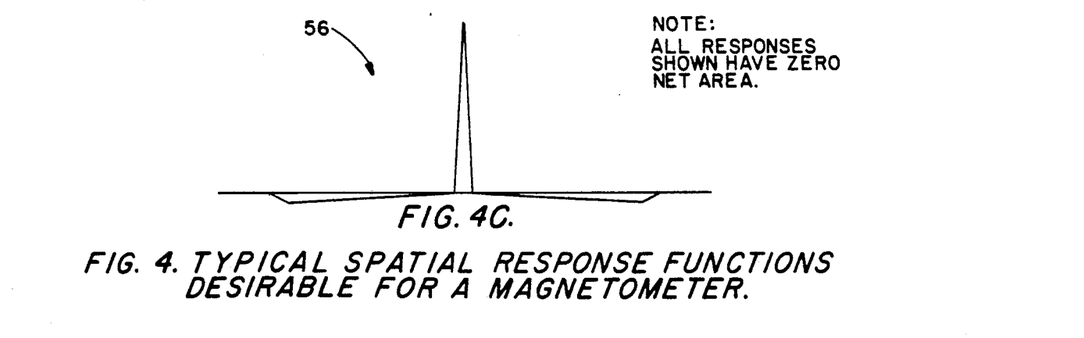

Some typical response functions, 52, 54 and 56, are shown in FIG. 4. The first one, 52, is well adapted to searching for a local anomoly in a slowly changing spatial background. The total net area is zero and hence the output is small if the spatial component of the field as seen at the central spike of the response pattern 52 is close to the average value seen over the remainder of the pattern. A localized anomaly, however, will result in a large output. The other two response functions 54 and 56 shown in FIG. 4 are variations on this approach which give different emphasis to different portions of the spatial response functions. Although the response functions, 52, 54 and 56, of FIG. 4 are likely to be the most useful for a wide range of applications, it is clearly possible to implement many other response functions with this class of processor. The achievable functions will all have zero net area if total rejection of the temporal component is required.

Choice of weight sequences and filter functions for a given application is quite flexible since many degrees of freedom are available to use in meeting conditions (a) and (b).

The single-channel case shown by the embodiment 1 in FIG. 1 and the multiple-channel case shown by the embodiment 10 in FIG. 2 will be considered separately. A convenient approach in the single-channel case (FIG. 1) is to choose a sequence having the desired number of weights and a spike-like autocorrelation function as a starting point. Examples of such sequences would include Barker codes, Huffman codes, and pseudo-random sequences. Those codes having small bias will be the most convenient starting point. For example, a Barker sequence whose length is odd and whose length minus one divided by two is odd will have a number of +1 entries which differs from its −1 entries by only 1. This makes a length 11 Barker code more convenient than one of length 13 for which the difference is 5.

Once a code of good autocorrelation properties is selected, it can be adjusted to zero bias by the addition of a constant or other convenient function of an index which does not too severely degrade the autocorrelation function. A filter can then be computed which, when convolved with the zero bias sequence, will approximate the specified response function.

Computation of the required filter is best done in the Fourier transform domain with the aid of a computer. Such techniques are commonly used for the computation of inverse or channel equalizing filters in communication systems. Any problems due to incompatible specifications will manifest themselves as excess length in the inverse filter or excessive dynamic range in its weights.

A good starting point in the multiple-channel case is a set of complementary sequences. Golay sequences are ideal for the 2-channel case, for example. A brief description and examples of Golay codes are given in U.S. Pat. No. 3,675,052, to Lindsay et al., dated July 4, 1972, entitled "Field-Delineated Acoustic Wave Device".

The approaches are then possible with a set of complementary sequences. The simplest is a modification of the single-channel approach (FIG. 1) in which those initial sequences which have zero bias are left unchanged along with their filter sequences. The sum of their autocorrelation functions is then subtracted from the desired response function to yield a function to be approximated by filtering the remaining sequences of the complementary set after their bias has been made zero.

This will not yield a unique inverse if there is more than one member of the initial set with nonzero bias since the residual correction can be apportioned among the filters in different ways. One approach is to apportion the correction to each filter in proportion to its zero bias version's autocorrelation function. This reduces the variation of the filter sequence from the weight sequence reversed and hence enhances the chances of achieving a reasonable finite-length result.

An alternate approach is to leave the bias of the original sequences uncorrected. The response to the spatial term if complementary sequences were chosen as a starting point is then a single spike. The temporal feedthrough appears multiplied by a sequence which is the sum of the original sequences reversed, each weighted by its own bias. An extra channel can now be added whose filter is this sequence and whose weight sequence has a bias which is equal to minus one. This specifies the dc coefficient of the transform of the weight sequence for this channel. The remaining degrees of freedom are used in approximating the difference between the desired response and the spike provided by the other channels. Since the length of the weight sequence is limited to the number of sensors, this approach is clearly less versatile than the previous one. The requirements imposed on this sequence are totally different from those imposed on the filter sequences in the first example. Hence it is possible to combine the two approaches to get the best tradeoff of residual errors.

It is also possible to treat the sum of the convolutions of the filter sequences and their respective weight sequences (after the sum of the filter sequences weighted by the bias of the corresponding weight sequences has been made zero) as a function to be converted into the desired response function by convolution with an additional sequence. This sequence, conveniently designed by Fourier transform techniques as in the single-channel case (FIG. 1), can then either be added after the final summation, or, alternatively, be convolved with the filter sequence of each channel to design a set of new filter sequences.

The processor structure of this invention provides a high degree of flexibility. As a result, the specific design approach used to choose weight sequences and filter sequences will depend on the computational resources available to the designer. Availability of computational facilities with extensive transform manipulating capabilities will generally motivate an inverse filtering approach. If computational facilities are severely limited, a design based on modification of common sequences, such as Barker sequences, can be obtained by hand calculation.

In either case, it is worthwhile to iterate the calculation with a few variations of the free parameters to achieve the best solution. These approaches are illustrated by the typical examples below.

COMPUTATIONAL EXAMPLES

Case I (FIG. 1).
  Single-channel system for measurement of local details in the spatial component of the Earth's field. The desired response function has the shape of the first response 52 in FIG. 4.

A length 11 Barker sequence is taken as the starting point. This implies the use of 11 sensors (12, FIG. 2). The sequence is $+++---+--+-$, and its autocorrelation function is $-0-0-0-0 \ 11 \ 0-0-0-0-0-$.

Figure 5:
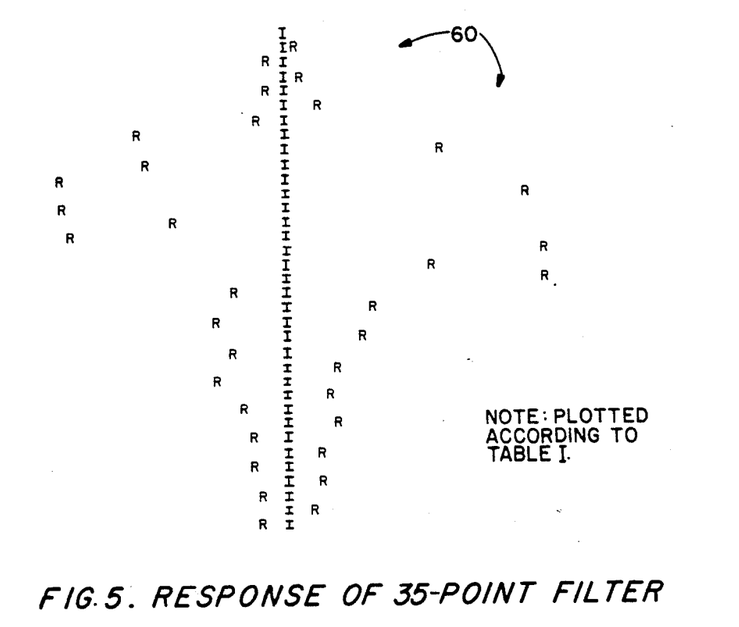
FIG. 5 shows a graph illustrating the response of a 35-point filter.

To set the bias to zero, a dc offset will be added to make the sum of the weights zero. The sequence then is $$\frac{\overline{12}}{11} \ \frac{\overline{12}}{11} \ \frac{\overline{12}}{11} \ \frac{\overline{10}}{11} \ \frac{\overline{10}}{11} \ \frac{\overline{10}}{11} \ \frac{\overline{12}}{11} \ \frac{\overline{10}}{11} \ \frac{\overline{10}}{11} \ \frac{\overline{12}}{11} \ \frac{\overline{10}}{11},$$

where the signs have been placed above their respective terms to avoid confusion. In other words, $$\frac{\overline{10}}{11}$$

is equal to $$-\frac{10}{11},$$

etc. Use of this sequence as the weight sequence will meet condition (a) since the sum of the weights is zero. A filter sequence must now be determined which when convolved with this weight sequence will give a function approximating the shape of the first response 52 of FIG. 4. If the Fourier transform of the desired spatial response be taken and divided by a modification of the transform of the weight sequence in which any zero points have been set to a nonzero value, the result will be the transform of a suitable filter sequence. These operations are most conveniently done via the discrete Fourier transform on a digital computer. It is important, however, to make a check to determine that a finite-length truncation of the computed sequence will have suitable properties since the discrete Fourier transform controls the periodic convolution properties. The computed sequence is shown in FIG. 5. The sequence has been truncated rather arbitrarily at length 35 after visual examination of a plot of the complete sequence. The corresponding output is tabulated below, TABLE I.

The slight residue outside the main portion of the response function is due to the tails of the filter function, which are needed to control sidelobe response within the main portion of the response. This residue is negligible for most applications and can easily be further reduced by choice of spatial response functions whose sidelobes taper at the ends.

TABLE 1

TABULATED SEQUENCE FOR 35-POINT FILTER
Real plot uses R, imaginary plot uses I as character.
MAX ABS value in array = 1.00000.

| 0 | .01152 |
|---|---|
| 1 | .04870 |
| 2 | −.07400 |
| 3 | .05579 |
| 4 | −.06682 |
| 5 | .13192 |
| 6 | −.09973 |
| 7 | −.57709 |
| 8 | .59449 |
| 9 | −.54875 |
| 10 | −.86355 |
| 11 | .94090 |
| 12 | −.85989 |
| 13 | −.42155 |
| 14 | −.83377 |
| 15 | .99986 |
| 16 | .56953 |
| 17 | 1.00000 |
| 18 | −.19017 |
| 19 | .32224 |
| 20 | −.26180 |
| 21 | .31076 |
| 22 | −.20798 |
| 23 | .20316 |
| 24 | −.25867 |
| 25 | .16304 |
| 26 | −.17923 |
| 27 | .18345 |
| 28 | −.14655 |
| 29 | .14688 |
| 30 | −.13522 |
| 31 | .12739 |
| 32 | −.11595 |
| 33 | .10718 |
| 34 | −.10389 |

Figure 3:
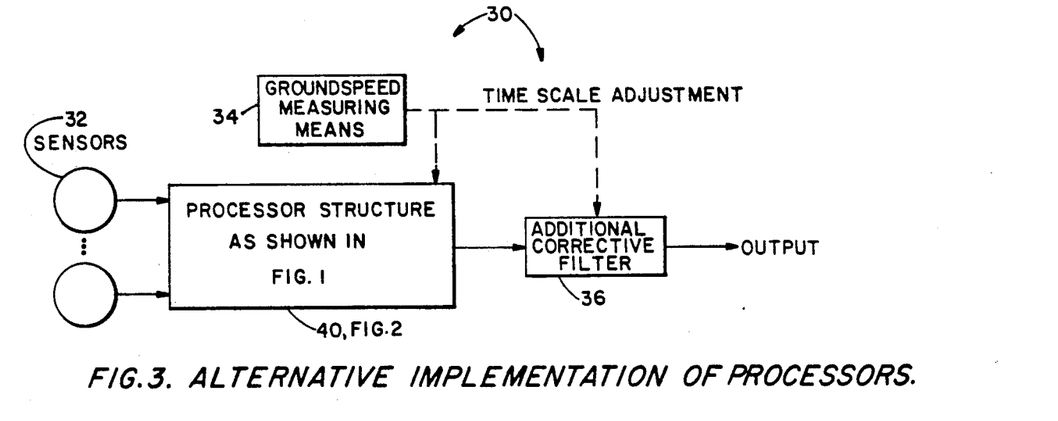
FIG. 3 is a block diagram showing the optional use of an additional corrective filter with the implementation of FIG. 2.

Case II (FIGS. 2 and 3).

Three-channel system for measurement of local details in the spatial component of the Earth's field. Desired response function has the shape of the first response 52, in FIG. 4.

As a starting point, the length-7 Barker sequence and the negative of its reverse will be taken. Instead of requiring individual channels to have zero mean, the third channel will be chosen to remove the residual temporal terms.

The first two channel weight sequences are:

$+ + + - - + -$ bias 1

$+ - + + - - -$ bias 1.

The corresponding filter sequences are the time reverse of these. The sum of the filter sequences multiplied by the biases of their corresponding weight sequences is:

$0\ 2\ 0\ \bar{2}\ 0\ 2\ 0,$ hence the filter for the third channel must have the form $0\ 1\ 0\ \bar{1}\ 0\ 1\ 0,$ and its weight sequences' bias must be −2. The contribution of the first two channels to the spatial sensitivity function is $\bar{2}.0.\bar{2}.0.\bar{2}.0.14.0.\bar{2}.0.\bar{2}.0.\bar{2}.$ It is reasonable to choose the third channel weight sequence to fill in some of the gaps in the negative sidelobes of this response. If the weight sequence

.50 .50 .50 .5 be chosen, the contribution of the third channel to the spatial sensitivity function will be $0\ .50\ 0\ 0\ .50\ .50\ 0\ 0\ .50$ for a total spatial response of $\bar{2}, .\bar{5}, \bar{2}, 0, \bar{2}, .\bar{5}, 14\ .5, \bar{2}, 0, \bar{2}, .\bar{5}, \bar{2}.$ This response has zero net area and approximates the desired response. The filter sequences have weights which are +1, −1, and 0 only. This could be an implementation convenience in some cases.

If it is desired to improve on this response, a modifying sequence for this net response can be designed. A filter 36 can then be cascaded with this response after the final sum, as in the alternative implementation 30 shown in FIG. 3; or, equivalently, the modifying sequence can be convolved with each of the three original filter sequences to generate three new filter sequences.

Figure 6:
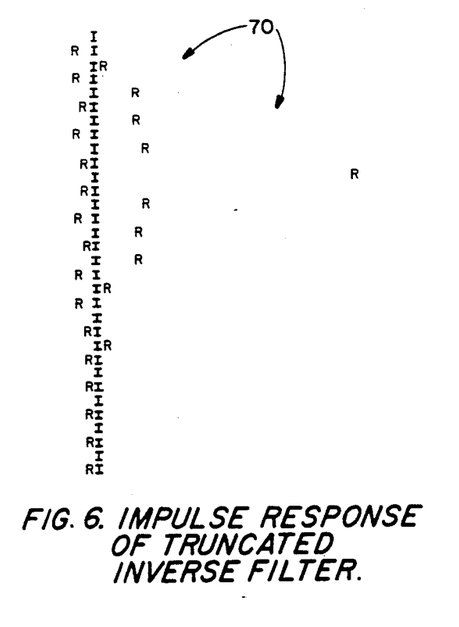
FIG. 6 is a graph showing the impulse response of a truncated inverse filter

For comparison with previous calculations, again a 21-point long spatial response with zero net area and constant sidelobe level will be chosen as the response it is desired to approximate. Solving for the required filter sequence as in Case I, the sequence 70 shown in truncated form in FIG. 6 is obtained. The complete sequence is shown in the accompanying tabulation, TABLE II. The long tail apparent in the tabulation is a sign that the candidate response function and the initial spatial response are not fully compatible.

Figure 7:
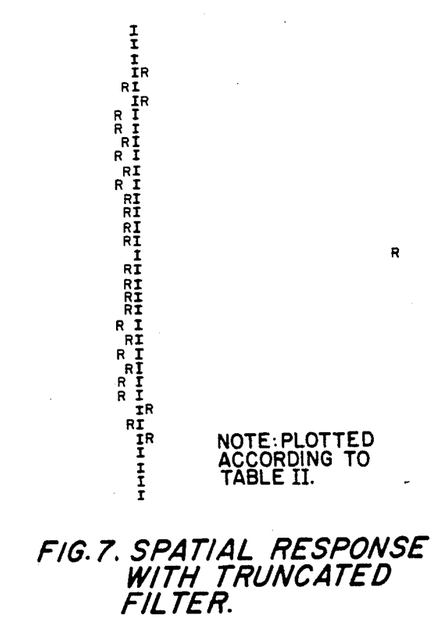
FIG. 7 is a graph showing the spatial response with a truncated filter.

If we take 21 points of the sequence, ten either side of the main peak, the response obtained is as shown in FIG. 7 and its accompanying tabulation, TABLE II, hereinbelow. The deviation of this response from the desired response near the ends is due to the truncation. Had a smooth taper to zero been added to the ends of the desired response, the corresponding filter would have been much less sensitive to truncation.

TABLE II

TABULATION OF SPATIAL RESPONSE WITH TRUNCATED FILTER (NORMALIZED)
Real plot uses R, imaginary plot uses I as character.
MAX ABS value in array = 1.00000.

| 0 | .00000 |
|---|---|
| 1 | .01237 |
| 2 | −.00127 |
| 3 | .02273 |
| 4 | −.02712 |
| 5 | .02396 |
| 6 | −.05435 |
| 7 | −.06579 |
| 8 | −.04802 |
| 9 | −.06021 |
| 10 | −.04765 |
| 11 | −.05520 |
| 12 | −.04945 |
| 13 | −.05000 |
| 14 | −.05000 |
| 15 | −.05000 |
| 16 | 1.00000 |
| 17 | −.05000 |
| 18 | −.05000 |
| 19 | −.05000 |
| 20 | −.05000 |
| 21 | −.05534 |
| 22 | −.04820 |

TABLE II:-continued

TABULATION OF SPATIAL RESPONSE WITH
TRUNCATED FILTER (NORMALIZED)
Real plot uses R, imaginary plot uses I as character.
MAX ABS value in array = 1.00000.

| | |
|---|---|
| 23 | −.06021 |
| 24 | −.04857 |
| 25 | −.06593 |
| 26 | −.05048 |
| 27 | .02382 |
| 28 | −.02768 |
| 29 | .02273 |
| 30 | −.00182 |
| 31 | .01223 |
| 32 | −.00055 |
| 33 | .00000 |

Figure 8:
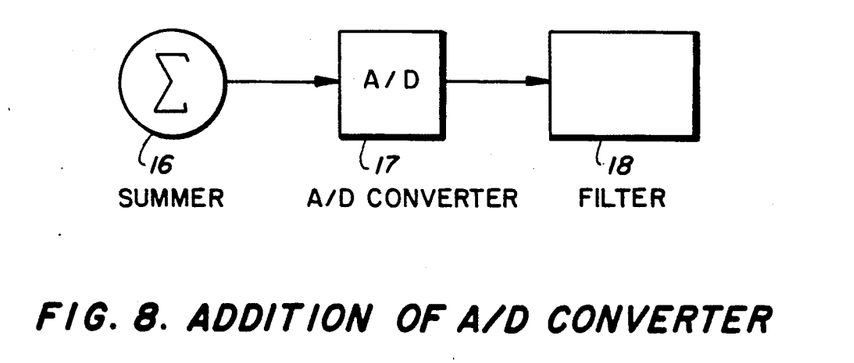
FIG. 8 is a block diagram showing an analog to digital conversion alternative to circuitry shown in FIG. 2.

The processor 10, FIG. 2, described herein can be implemented in either analog or digital form or as a hybrid of both techniques It will generally be convenient to implement the weighting operations in weights 14, and the initial summations, in summers 16, in analog form. The filters can then be implemented as charge transfer devices. Charge transfer devices are particularly well suited to this application since their clock rate can be varied to match the intersample delay to the time required for a sensor to advance the intersensor separation. If an analog-to-digital converter 17 (FIG. 8), is used on the output of each summation, that is, between summers 16 and filters 18, the filters and subsequent sum, in output summer 22, can be implemented in digital form.

An all-digital implementation based on use of a microprocessor chip to control data flow in memory would also be a convenient implementation.

The magnetic field sensors 12 used can be fluxgate magnetometers, proton precession magnetometers, or any of a variety of total field measuring instruments. Vector magnetic field sensors would require either separate processing to derive a rotation-insensitive measure of total field or must be kept in fixed relative orientation.

An interesting variation of the approach of this invention which is also realizable with the processor structure 10 of FIG. 2 can be used to obtain an estimate of the temporal component in which the spatial component is greatly diminished. In this case conditions (a) and (b) are replaced by $$(\hat{A}) \sum_{k=0}^{M-1} \left( \sum_{i=0}^{N-1} W_{ik} \right) F_{jk}$$

approximates the desired temporal response function $$(\hat{B}) \sum_{k=0}^{N-1} W_{ik} * F_{jk} = 0$$

Choice of weights and filter sequences for this case is quite similar to the previous case except that a multiple-channel implementation is required for complete rejection of the spatial component.

A convenient starting point is provided by noninteracting sequences. These are sets of sequences whose autocorrelation functions sum to zero. These would be used as the weight sequences and their reverses would be used as the corresponding filter sequences. The spatial component will cancel and the temporal component will appear multiplied by a sequence which is the sum of the reversed noninteracting sequences in which each is weighted by its bias. An inverse filter for this sum sequence can then be computed to provide the desired temporal response. The temporal response functions must be selected from the family of sequences having zero net area. This inverse filter can be cascaded as an additional filter 36 after the output sum as in FIG. 3 or its sequence can be convolved with each of the initial filter sequences to provide the functions to actually be used in the filters.

Obviously, many other modifications and variations of the present invention are possible in the light of the above teachings. It is therefore to be understood that within the scope of the appended claims the invention may be practiced otherwise than as specifically described.

What is claimed is:

1. A mobile magnetometry processing system which scans an area in order to measure the magnetic field strength over the area, comprising:

a plurality of N means for sensing the magnetic field of the area being scanned, each sensing means generating an output signal, for example, a voltage, which is a function of the magnetic field it scans, the sensing means being aligned in the general direction of the motion of the system;

a plurality of N sets of means for weighting, wherein each of the N sets comprises M weighting means, said weighting means receiving the output signals from the N sensing means and adjusting said output signal amplitudes by preselected weighting manner, for example, adjusting said output signal amplitudes by preselected weighting factors $W_{ik}$ according to the equation $C_k = \Sigma P_i W_{ik}$ where $P_i$ represents said output signals, and $C_k$ represents the weighted signals that are output from the weighting means;

a plurality of M means for summing, each having N inputs, one from each of the N sets of means for weighting, for summing its N input weighted signals;

a plurality of M means for filtering, each having an input which is connected to the output of a means for summing, for delaying the exit of an input signal by an amount of time equal to the time required for the mobile system to move a distance equal to that distance existing between two adjacent sensing means, wherein the filtering means performs convolution processes;

means, associated with the M means for filtering, for measuring the velocity of the magnetometry processing system and thereby determining the intersensor delay of the M means for filtering; and an output means for summing, whose M inputs are connected to the outputs of the M means for filtering, the signal output from said output means for summing being a measure of the strength of the magnetic field of the area being transversed by the means for sensing.

2. The magnetometry processing system according to claim 1 further comprising:

means, whose input is connected to the output of the output means for summing, for filtering and modifying the output signal from the output means for summing.

3. The magnetometry processing system according to claim 1 wherein:

the means for sensing comprise flux gate magnetometers.

4. The magnetometry processing system according to claim 1 wherein:

the means for sensing comprise proton precession magnetometers.

5. The magnetometry processing system according to claim 1 wherein:

the means for sensing comprise vector magnetic field sensors.

6. The magnetometry processing system according to claim 1 wherein:

the means for weighting comprise analog devices.

7. The magnetometry processing system according to claim 1 wherein:

the means for summing comprise analog devices.

8. The magnetometry processing system according to claim 1 wherein:

the means for filtering comprise charge transfer devices.

9. The magnetometry processing system according to claim 1 further comprising:

a plurality of means for converting an analog signal to a digital signal each means having an input connected to a means for summing and an output connected to a means for filtering.

10. The magnetometry processing system according to claim 9 wherein:

the means for filtering are implemented in digital form; and the output means for summing is implemented in digital form.

* * * * *